United States Patent [19]

Ko

[11] Patent Number: 5,793,317

[45] Date of Patent: Aug. 11, 1998

[54] LOW POWER APPROACH TO STATE SEQUENCING AND SEQUENTIAL MEMORY ADDRESSING IN ELECTRONIC SYSTEMS

[75] Inventor: Uming Ko, Plano, Tex.

[73] Assignee: Texas Instruments Incorporated, Dallas, Tex.

[21] Appl. No.: 853,612

[22] Filed: May 9, 1997

Related U.S. Application Data

[63] Continuation of Ser. No. 315,534, Sep. 30, 1994, abandoned.

[51] Int. Cl.$^6$ ............................................. G06F 12/02
[52] U.S. Cl. ................................................ 341/98; 341/50
[58] Field of Search ............................ 341/98, 63, 50

[56] References Cited

U.S. PATENT DOCUMENTS

| 5,255,378 | 10/1993 | Crawford et al. | 395/325 |
| 5,300,930 | 4/1994 | Burger et al. | |
| 5,330,930 | 7/1994 | Burger | 341/96 |
| 5,339,119 | 8/1994 | Raatz et al. | 364/760 |
| 5,452,215 | 9/1995 | Washabaugh | 364/468 |

FOREIGN PATENT DOCUMENTS 2239113  6/1991  United Kingdom ............ G06F 12/02

OTHER PUBLICATIONS

Intel Corporation, "Intel 486™ DX Microprocessor," Intel 486 DX Microprocessor Data Book, Oct. 1992, pp. 1, 2 and 113.

*Primary Examiner*—Jeffrey A. Gaffin
*Assistant Examiner*—Peguy JeanPierre
*Attorney, Agent, or Firm*—Lee E. Chastain; James C. Kesterson; Richard L. Donaldson

[57] ABSTRACT

An electronic apparatus (24, 25, 27) having a plurality of externally selectable operating states is controlled to assume sequentially those states. The control is accomplished (41, 43, 45) using a sequence of state codes which define a reflected code.

7 Claims, 5 Drawing Sheets

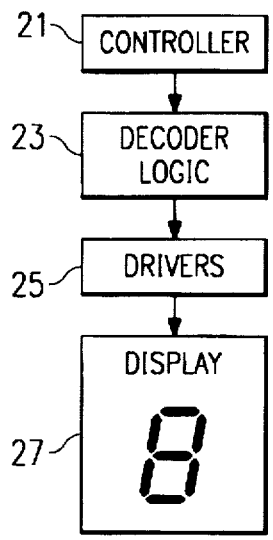
FIG. 1A
(PRIOR ART)
| CONTROLLER OUTPUT | BIT TRANSITIONS |
|---|---|
| 0000 | |
| 0001 | 1 |
| 0010 | 2 |
| 0011 | 1 |
| 0100 | 3 |
| 0101 | 1 |
| 0110 | 2 |
| 0111 | 1 |
| 1000 | 4 |
| 1001 | 1 |
| 0000 | 2 |
| 0001 | |
| ⋮ | |
FIG. 1B
(PRIOR ART)
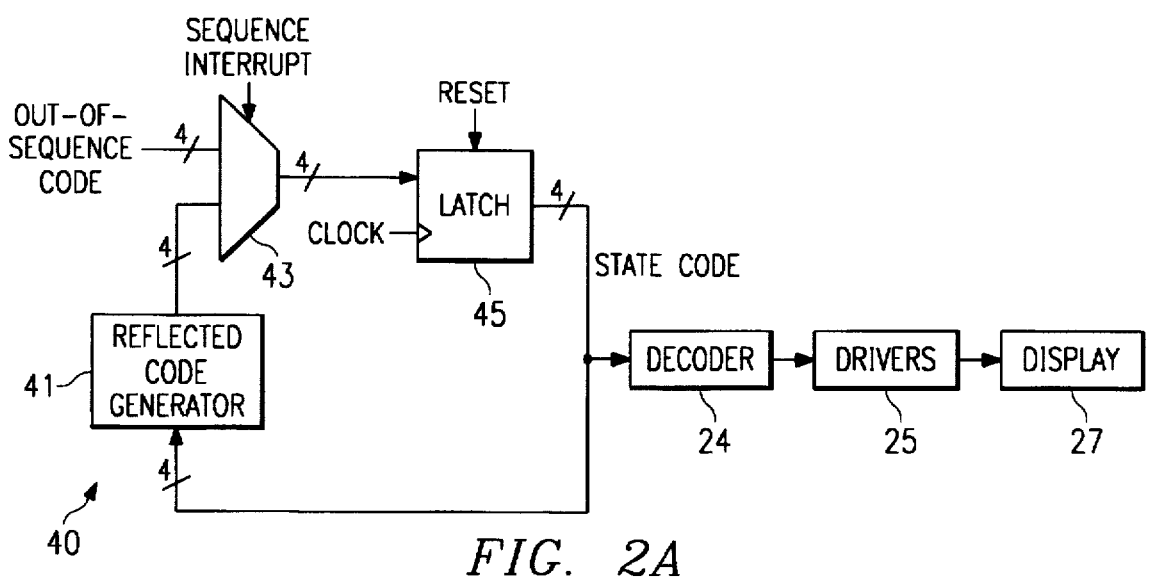
FIG. 2A

| REFLECTED CODE | BIT TRANSITIONS | DECIMAL EQUIVALENT |
|---|---|---|
| 0000 |   | 0 |
| 0001 | 1 | 1 |
| 0011 | 1 | 2 |
| 0010 | 1 | 3 |
| 0110 | 1 | 4 |
| 0111 | 1 | 5 |
| 0101 | 1 | 6 |
| 0100 | 1 | 7 |
| 1100 | 1 | 8 |
| 1101 | 1 | 9 |
| 0000 | 3 | 0 |
| 0001 |   | 1 |
| ⋮ |   |   |
*FIG. 2B*
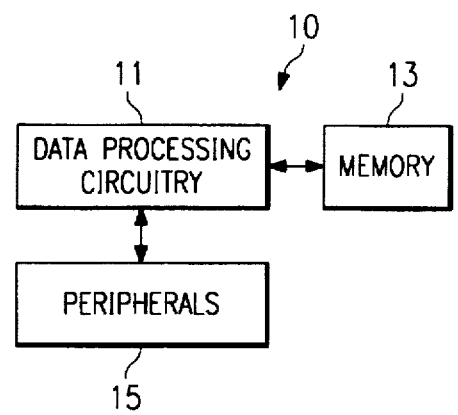
*FIG. 3*
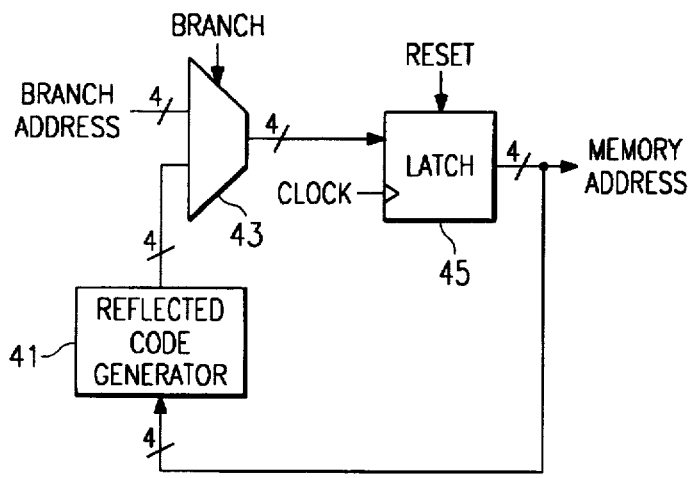
*FIG. 4*
| REFLECTED CODE ADDRESS | BIT TRANSITIONS |
|---|---|
| 0000 |   |
| 0001 | 1 |
| 0011 | 1 |
| 0010 | 1 |
| 0110 | 1 |
| 0111 | 1 |
| 0101 | 1 |
| 0100 | 1 |
| 1100 | 1 |
| 1101 | 1 |
| 1111 | 1 |
| 1110 | 1 |
| 1010 | 1 |
| 1011 | 1 |
| 1001 | 1 |
| 1000 | 1 |
| 0000 | 1 |
*FIG. 5*

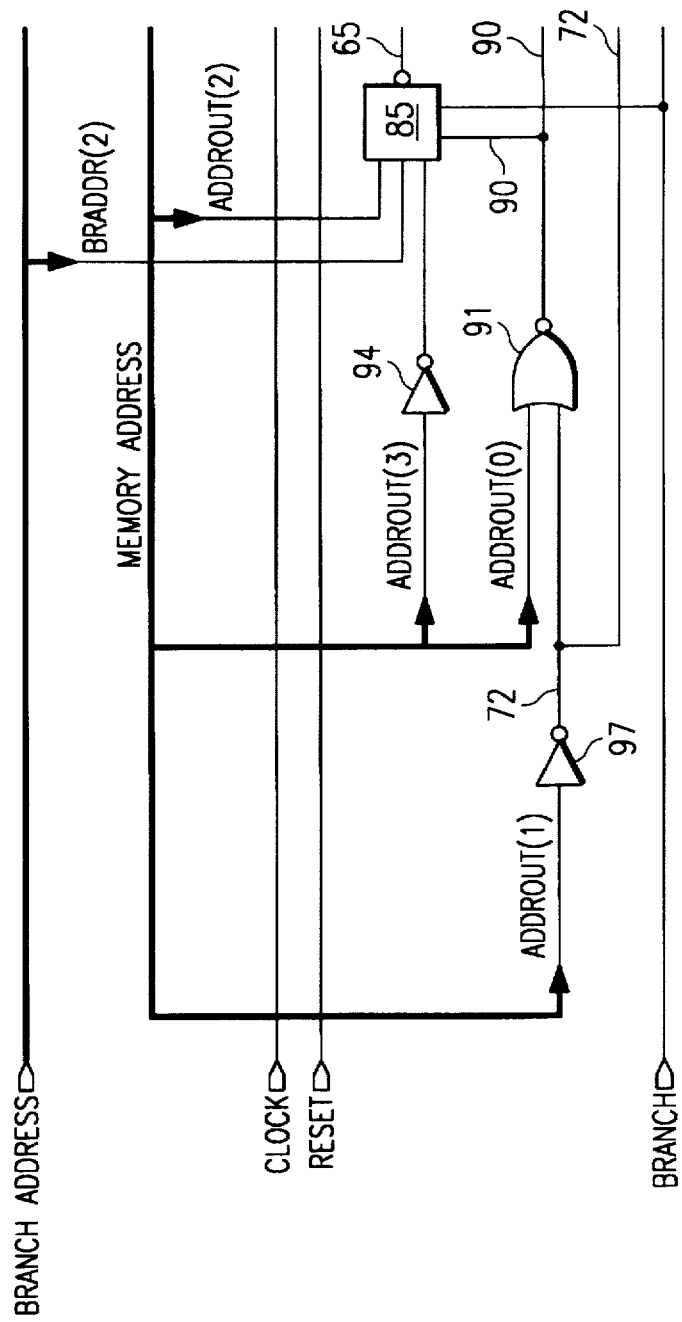

LOW POWER APPROACH TO STATE SEQUENCING AND SEQUENTIAL MEMORY ADDRESSING IN ELECTRONIC SYSTEMS

This application is a Continuation of application Ser. No 08/315,534 filed on Sep. 30, 1994 of Uming Ko. for Low Power Approach to State Sequencing and Sequential Memory Addressing in Electronic Systems now abandoned.

FIELD OF THE INVENTION

The present invention relates to electronic systems which utilize state machines to control sequential operations and, more particularly, to the design of such state machines for use in electronic systems in which low power consumption is important.

BACKGROUND OF THE INVENTION

Electronic controllers including state machines are used in myriad applications which touch virtually every aspect of life. In applications where the controller uses battery power for any substantial length of time, it is particularly desirable to be able to minimize the power consumption of the controller. Examples of systems which include electronic controllers with state machines and which use battery power for substantial periods of time include such portable data processing systems as notebook and sub-notebook computer systems, and digital watches.

FIG. 1A illustrates a conventional system in which an electronic controller 21 is used to control operation of a 7-segment display 27 used to display seconds in a digital watch. The controller 21 typically includes a state machine which outputs to a decoder 23 a sequence of binary coded decimal (BCD) values as shown in FIG. 1B. The decoder 23 decodes each BCD value and activates the appropriate drivers 25 to cause the display 27 to display the decimal equivalent of the BCD value presented to the decoder 23 by the controller 21. As shown in FIG. 1B, the controller 21 sequences incrementally through BCD values from 0000 through 1001 and then back to 0000, corresponding in decimal to a sequence from 0 through 9 and back to 0, which decimal sequence appears in display 27 by operation of decoder 23 and drivers 25 in response to controller 21.

FIG. 1B also illustrates the number of bit transitions required to produce each value in the BCD sequence. For example, one bit transition is associated with the change from 0000 to 0001, and three bit transitions are associated with the transition from 0011 to 0100. Totaling the bit transition column of FIG. 1B reveals that the BCD scheme requires a total of 18 bit transitions for each complete cycle of the display 27 from 0 back to 0.

Turning now to the data processing systems mentioned above, and considering a typical program execution sequence implemented therein, the program execution jumps to a first sequence of instruction codes stored at a first sequence of memory addresses, sequentially accesses and executes that sequence of instruction codes, and then loops back to the beginning of the sequence to sequentially access and execute the sequence of instruction codes again. This process is repeated until the instruction code sequence has been executed a desired number of times, whereupon program execution jumps to the beginning address of another instruction code sequence which is also sequentially accessed and executed, and then repeated as many times as necessary, after which program execution then jumps to the beginning address of another sequence of instruction codes.

As seen from the above data processing example, a large portion of data processing time is often devoted to sequentially accessing and executing a sequence of instruction codes stored at a sequence of memory addresses. In general, ROMs and instruction RAMs are often sequentially accessed to obtain and execute sequences of program instructions stored therein. Data processing systems which utilize micro-instructions, or micro-code, also use sequential memory accesses extensively, as do systems wherein a data processing device communicates off-chip for external memory burst sequence accesses.

In conventional data processing systems, the above-described type of instruction sequence is addressed by using the BCD sequence of FIG. 1B as an address sequence, so that the instructions are successively addressed by successive addresses in the BCD sequence.

Given that power dissipation P is represented by the equation $P=CV^2f$, where C is the effective power dissipation capacitance, V is a fixed operating voltage, and f is effective transition frequency, the present invention recognizes that the power dissipated by the system of FIG. 1A and by the above-described data processing systems can be reduced by providing a control/address sequence having fewer bit transitions, and thus a lower effective transition frequency, than the BCD sequence of FIG. 1B.

The present invention provides an electronic controller having a state machine which implements a sequencing technique that requires fewer bit transitions than the prior art BCD approach.

BRIEF DESCRIPTION OF THE DRAWINGS

FIG. 1A illustrates a conventional system utilizing state sequencing;

FIG. 1B illustrates a state sequencing technique according to the prior art;

FIG. 2A illustrates a controller for performing state sequencing according to the invention;

FIG. 2B illustrates a state sequencing technique associated with the controller of FIG. 2A;

FIG. 3 is a block diagram of a data processing system according to the present invention;

FIG. 4 illustrates in more detail an address generator of the data processing circuitry of FIG. 3;

FIG. 5 illustrates a sequential memory addressing technique associated with the address generator of FIG. 4;

FIG. 6 illustrates how FIGS. 6A-6D are to be arranged for viewing them as a single figure;

FIGS. 6A-6D diagrammatically illustrate the address generator of FIG. 4 in greater detail;

DETAILED DESCRIPTION

Figure 6B:
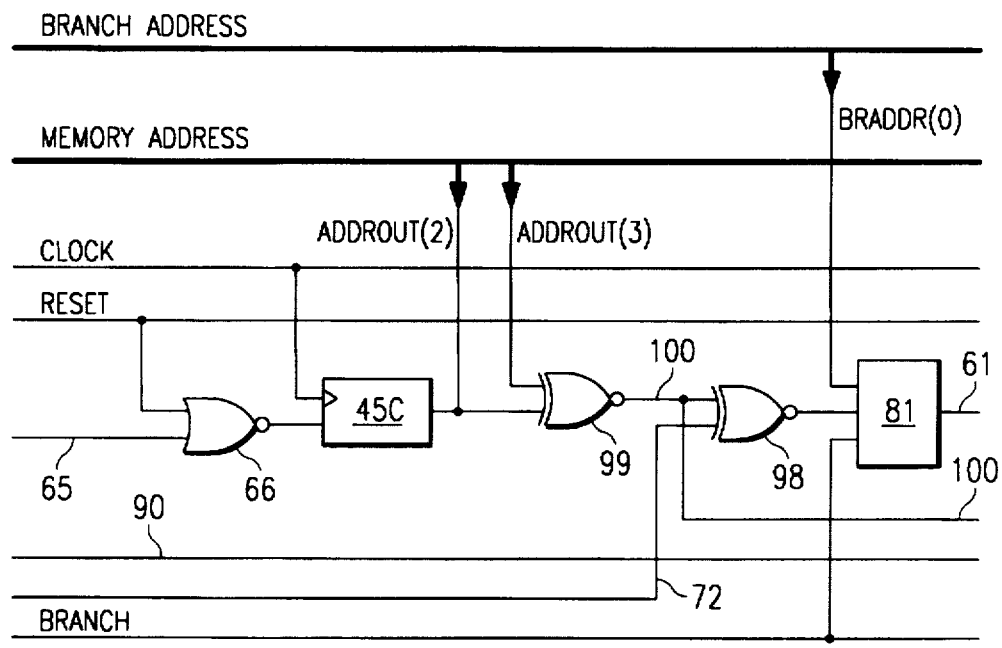

FIG. 2A illustrates a controller according to the present invention for providing state sequencing to control, for example, a 7-segment display such as shown at 27 in FIG 1A. As shown in FIGS. 2A and 2B, the controller of FIG. 2A includes a state machine 40 which implements a reflected code (or Gray code) state sequence wherein only one bit transition is required to transition from a given state to the next sequential state. As seen from FIG. 2B, only the transition from 1101 (decimal 9) to 0000 (decimal 0) requires more than one bit transition, namely three bit transitions. Totaling the bit transition column of FIG. 2B reveals that the reflected code approach of FIGS. 2A and 2B requires 12 bit transitions to execute the sequence from 0 through 9 and back to 0, as compared to 18 for the prior art approach of FIGS. 1A and 1B. Thus, the controller of FIG. 2A has a reduced effective transition frequency relative to the controller of FIG. 1A, thereby advantageously providing a corresponding reduction in power consumption.

In the exemplary state machine circuitry 40 of FIG. 2A, a reflected code generator 41 is connectible to the input of latch circuitry 45 via multiplexer 43. When connected to the latch circuit 45 via multiplexer 43, the reflected code generator 41 provides latch circuit 45 with a 4-bit reflected code value. This reflected code value is clocked through the latch circuit 45 and becomes the state code which is input to a decoder 24 similar to the decoder 23 of FIG. 1A. The state code output from latch circuitry 45 is also fed back to reflected code generator 41. The reflected code generator 41 generates the next 4-bit state code in response to the feedback state code. Thus, upon the next clock pulse, the next code value in the reflected code sequence is clocked through latch circuitry 45 to become the next state code in the state sequence input to decoder 24. Decoder 24 decodes the reflected code values of FIG. 2B into their respective decimal equivalents in order to drive the drivers 25 appropriately to obtain the desired decimal character in the display 27.

If it is desired to insert an out-of-sequence code into the state code sequence, then the sequence interrupt signal selects the out-of-sequence code input of multiplexer 43 for connection to the input of latch circuitry 45. This out-of-sequence code becomes the next state code output from latch circuitry 45 upon the next clock pulse. The out-of-sequence state code is also fed back to reflected code generator 41 so that the reflected code generator 41 can generate the reflected code value which follows the out-of-sequence code, whereby the state code sequence output from latch circuitry 45 can, beginning from the out-of-sequence code, resume the reflected code sequence by simply disabling the sequence interrupt signal and again selecting the reflected code generator output to be latched through latch circuitry 45 upon the next clock pulse. Thus, the multiplexer 43 provides the capability of interrupting the reflected code sequence and inserting an out-of-sequence code, and thereafter resuming the reflected code sequence beginning with the out-of-sequence code. The reset input of FIG. 2A permits the state code output of latch circuitry 45 to be asynchronously set to 0 when desired.

FIG. 3 is a block diagram of a data processing system 10 according to the present invention. The data processing system 10 includes data processing circuitry 11, memory circuitry 13, and a plurality of peripheral circuitries 15. The data processing circuitry 11 uses sequential memory addressing techniques to obtain from memory circuitry 13 selected sequences of program instructions for sequential execution by the data processing circuitry 11. In the exemplary embodiment of FIG. 3, the data processing circuitry 11 is shown connected to a plurality of peripheral circuitries 15 for transfer of information between data processing circuitry 11 and the peripheral circuitries 15. However, and as will be apparent from the following description, a data processing system according to the present invention could include any quantity and type of peripheral circuitries and peripheral devices (such as peripherals 15) interconnected among themselves and with data processing circuitry 11 in any manner heretofore or hereafter conceivable to workers in the art. Examples include: data processing circuitry 11, a microprocessor; memory circuitry 13, a ROM or instruction RAM; one peripheral 15, a graphics control unit for controlling a graphics display; another peripheral 15, a bus control unit. As other examples, data processing circuitry 11 and memory circuitry 13 could be provided in a single integrated circuit such as a microprocessor, and one or more peripherals 15 could also be provided either on or off-chip.

FIG. 4 illustrates an address generator of data processing circuitry 11 used to perform sequential addressing of the memory circuitry 13 of FIG. 3. The address generator of FIG. 4 is analogous to the controller of FIG. 2A, and analogous components in FIG. 4 are numbered the same as in FIG. 2A. As shown in FIGS. 4 and 5, the circuitry of FIG. 4 implements a reflected code (or Gray code) addressing scheme wherein only one bit transition is required to transition from a given address to the next sequential address. Thus, in order to address a sequence of 16 program instructions, only 16 bit transitions are required, as compared to 30 bit transitions required by the prior art BCD addressing scheme. Assuming that the sequential addressing technique of FIG. 5 will impact approximately 30% of the total power required to operate memory circuitry 13, then the reflected code technique of FIG. 5 will reduce by 26.25%, as compared to the conventional BCD approach, the power dissipation associated with the memory circuitry 13. The power savings associated with the technique of FIG. 5 will increase as the number of address bits increases. More specifically, if n is the number of address bits, then the bit transition ratio of BCD to reflected code is given by $2-2^{(1-n)}$. For n=4, the ratio is $2-2^{(1-4)}=1.875=30/16$. The larger n becomes, the larger the ratio of bit transitions and thus the larger the power savings provided by the reflected code technique of FIG. 5.

In the exemplary sequential memory addressing circuitry of FIG. 4, a multiplexer 43 selects between a branch address and a sequential address generated by a reflected code generator 41. Multiplexer 43 is controlled by a branch signal provided by the program execution portion of the data processing circuitry 11. The 4-bit address output from multiplexer 43 is input to latch circuitry at 45. The 4-bit address is then clocked through latch circuitry 45 for use in addressing the memory circuitry 13. The 4-bit address output from the latch circuitry 45 is also fed back to the reflected code generator 41. The reflected code generator 41 generates the next 4-bit address in the reflected code sequence in response to the feedback memory address.

Figure 7:
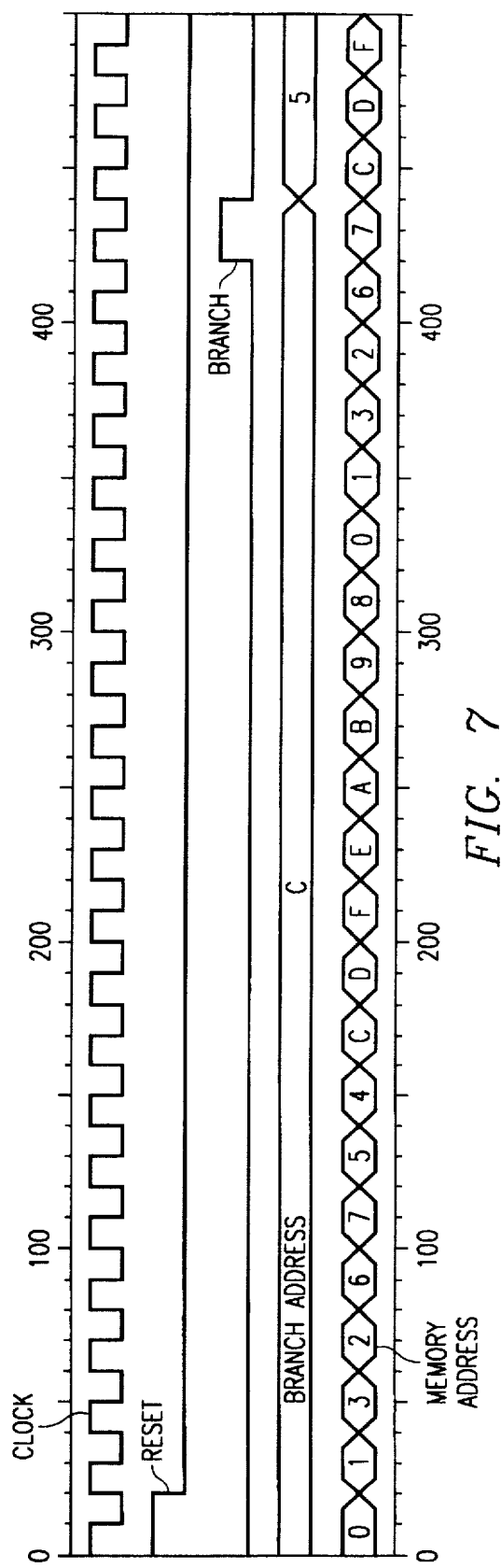
FIG. 7 is a timing diagram which illustrates the operation of the circuitry of FIGS. 4 and 6A-6D.

The timing diagram of FIG. 7 illustrates the operation of the sequential memory addressing circuitry of FIG. 4. The reset signal is initially active high in FIG. 7, thus clearing the memory address output of latch circuitry 45 to 0. With the branch signal inactive low, the 4-bit output of reflected code generator 41 is selected at multiplexer 43. With address 0 input to the reflected code generator at 41, the output of reflected code generator 41 is address 1 which is passed through multiplexer 43 to the inputs of latch circuitry 45. On the first clock pulse after reset goes inactive low, address 1 is clocked through latch circuitry 45 so that address 1 is used as the memory address for accessing memory circuitry 13. Address 1 is also fed back to reflected code generator 41, which generates the next sequential address in the reflected code, namely address 3, for input to the latch circuitry 45 via multiplexer 43. Thus, on the second clock pulse after reset goes inactive low, address 3 is clocked through latch circuitry 45 for use as the memory address for accessing memory 13. As shown in FIG. 7, the memory address output from latch circuitry 45 steps through the entire reflected code sequence of FIG. 5, because each current memory address is fed back to the reflected code generator 41 which then generates the next sequential address in the reflected code, which next sequential address is then clocked through latch circuitry 45 on the next clock pulse.

When the branch signal goes active high in FIG. 7, the multiplexer 43 passed the 4-bit branch address, namely address C, to the inputs of latch circuitry 45. Upon the next clock pulse, the branch address C is clocked through latch circuitry 45 to become the new memory address for use in accessing memory 13. Branch address C is fed back to the input of reflected code generator 41, whereupon reflected code generator 41 generates the next address in the reflected code sequence, namely address D. With the branch signal again inactive low, the address D is passed from the reflected code generator 41 through multiplexer 43 to latch circuitry 45, and is clocked through latch circuitry 45 upon the next clock pulse.

Figure 6C:
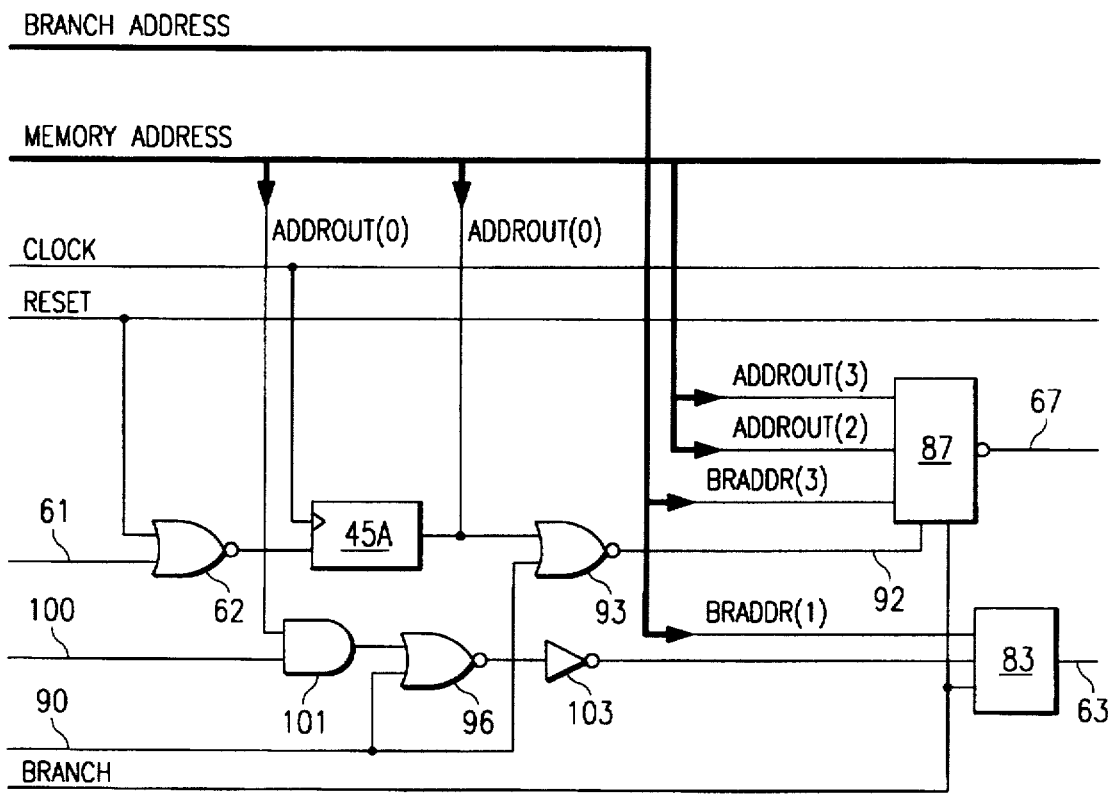
Figure 6D:
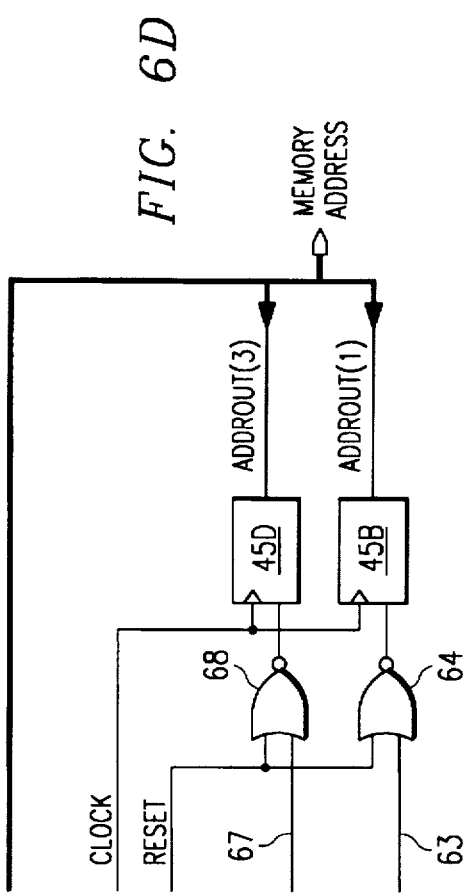

FIGS. 6A–6D are to be viewed together as one single figure, and FIG. 6 shows how FIGS. 6A–6D should be arranged for such viewing. FIGS. 6A–6D illustrate an exemplary gate—level implementation of the sequential addressing circuitry of FIG. 4. The latch circuitry 45 of FIG. 4 is implemented in FIGS. 6A–6D as four D flip-flops 45A–45D. The reset function of FIG. 4 is implemented in FIGS. 6A—6D by gating the flip-flop inputs 61, 63, 65 and 67 through respective NOR gates 62, 64, 66 and 68, with the other input of NOR gates 62, 64, 66 and 68 being the reset signal. Thus, when the reset signal is active high, the outputs of NOR gates 62, 64, 66 and 68 are low, thereby forcing the outputs of flip-flops 45A–45D low upon the next clock pulse.

Aside from D flip-flops 45A–45B and NOR gates 62, 64, 66 and 68, the remaining circuitry of FIGS. 6A–6D implements the reflected code generator 41 and the multiplexer 43 of FIG. 4. In FIGS. 6A–6D, the individual bits of the 4-bit memory address are designated addrout(n), and the individual bits of the 4-bit branch address are designated braddr (n). In both designations, the value of n increases with increasing bit significance, such that, for example, addrout (0) is the least significant bit of the memory address, and braddr(3) is the most significant bit of the branch address. As in FIG. 4, the branch signal is active high to select the branch address bit braddr(n) at each of multiplexers 81, 83, 85 and 87. When the branch signal is inactive low, then an address bit of the next address in the reflected code sequence is selected at each of multiplexers 81, 83, 85 and 87.

Multiplexer 85 of FIG. 6A has a second control input 90 connected to the output of NOR gate 91, and multiplexer 87 of FIG. 6C has a second control input 92 connected to the output of NOR gate 93. When control signal 90 is logic 0 and the branch signal is inactive low, addrout(2) is selected by multiplexer 85. When control signal 90 is logic 1 and the branch signal is inactive low, the output of invertor 94 is selected by multiplexer 85. When control signal 92 is logic 0 and the branch signal is inactive low, addrout(3) is selected by multiplexer 87. When control signal 92 is logic 1 and the branch signal is inactive low, addrout(2) is selected by multiplexer 87. Multiplexer 85 selects braddr(2) when the branch signal is high, and multiplexer 87 selects braddr(3) when the branch signal is high.

The signal 90 output from NOR gate 91 also drives an input of NOR gate 96 (FIG. 6C) and an input of NOR gate 93 (FIG. 6C). Invertor 97 (FIG. 6A) has an input connected to addrout(1) and an output 72 which drives an input of NOR gate 91 and an input of exclusive-OR gate 98 (FIG. 6B). The other input of NOR gate 91 is connected to addrout(0). Exclusive-OR gate 99 (FIG. 6B) has respective inputs connected to bits addrout(2) and addrout(3) of the memory address. Exclusive-OR gate 99 has an output 100 which drives one input of exclusive-OR gate 98 and also drives one input of AND gate 101 (FIG. 6C) whose other input is driven by bit addrout(O) of the memory address. The output of AND gate 101 drives an input of NOR gate 96. The output of NOR gate 96 is connected to the input of an invertor 103 whose output is connected to a data input of multiplexer 83.

The aforementioned signals at 61, 63, 65 and 67 are respectively output from multiplexers 81, 83, 85 and 87.

Figure 8:
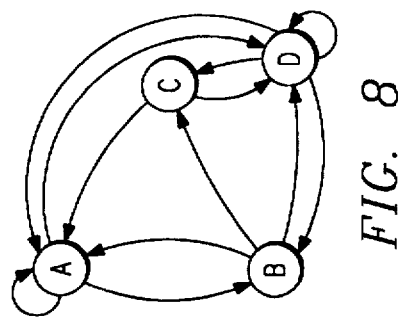
FIG. 8 is an exemplary state diagram of state machine circuitry to which the present invention is applicable.

The techniques of the present invention may be applied to any state machine application. Assuming for example that the state machine has a state diagram of the type shown in FIG. 8, the most frequently used state sequence can be assigned a reflected code sequence. For example, if the most frequently executed state sequence is A to B to C to D to A, then states A, B, C and D can be respectively assigned the first four reflected code values in FIG. 2B, so that the A to B to C to D to A sequence is represented as the following state code sequence at the output of the FIG. 2A latch 45: 0000 (A) to 0001 (B) to 0011 (C) to 0010 (D) to 0000 (A). This reflected code sequence requires four bit transitions, as compared to six bit transitions, in the best case, using the sequence of prior art FIG. 1B.

Although exemplary embodiments of the present invention are described above, this does not limit the scope of the invention, which can be practiced in a variety of embodiments.

What is claimed is:

1. An electronic controller for controlling an electronic apparatus responsive to an external stimulus to assume sequentially a plurality of operating states, comprising:

an output for connection to an input of the electronic apparatus;

an input for receiving an out-of-sequence state code;

state machine circuitry for providing at said output a sequence of state codes which defines a sequence of operating states to be assumed by the electronic apparatus, said state machine circuitry including a reflected code generator coupled to said output; and a sequence interruptor which permits said sequence of state codes to be interrupted at said output, wherein the sequence interrupter initially outputs the out-of-sequence state code and wherein the state machine circuitry continues outputting the sequence of state codes beginning with a state immediately subsequent to the out-of-sequence state code.

2. The controller of claim 1, wherein said sequence of state codes provided by said state machine circuitry defines a reflected code sequence.

3. An electronic system, comprising:

an electronic apparatus responsive to an external stimulus to assume sequentially a plurality of operating states; and a controller for controlling said electronic apparatus, said controller including an input for receiving an out-of-sequence state code and an output connected to an input of said electronic apparatus, state machine circuitry for providing at said output a sequence of state codes which defines a sequence of operating states to be assumed by said electronic apparatus, said state machine circuitry including a reflected code generator coupled to said output of said controller, and a sequence interruptor which permits said sequence of state codes to be interrupted at said output, wherein the sequence interrupter initially outputs the out-of-sequence state code and wherein the state machine circuitry continues outputting the sequence of state codes beginning with a state immediately subsequent to the out-of-sequence state code.

4. The system of claim 3, wherein said electronic apparatus includes decoding logic connected to said input of said electronic apparatus for decoding the state codes provided by said state machine circuitry to produce decoded state information.

5. The system of claim 4, wherein said electronic apparatus includes a display apparatus coupled to said decoding logic for producing visual displays in response to the decoded state information produced by said decoding logic.

6. The system of claim 3, wherein said sequence of state codes provided by said state machine circuitry defines a reflected code sequence.

7. A method of controlling an electronic apparatus responsive to an external stimulus at an input thereof to assume sequentially a plurality of operating states, comprising the steps of:

generating a sequence of state codes which defines a sequence of operating states to be assumed by the electronic apparatus and which also defines a reflected code sequence;

applying the sequence of state codes to the input of the electronic apparatus;

receiving an out-of-sequence state code;

outputting the out-of-sequence state code to the input of the electronic apparatus; and generating the sequence of state codes beginning with a state immediately subsequent to the out-of-sequence state code.

* * * * *